United States Patent
Aoki

(10) Patent No.: US 8,527,717 B2
(45) Date of Patent: Sep. 3, 2013

(54) CONTENT DATA STORAGE DEVICE AND ITS CONTROL METHOD

(75) Inventor: Toshiaki Aoki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 762 days.

(21) Appl. No.: 12/024,173

(22) Filed: Feb. 1, 2008

(65) Prior Publication Data

US 2008/0232175 A1   Sep. 25, 2008

(30) Foreign Application Priority Data

Mar. 19, 2007   (JP) ................................. 2007-070925

(51) Int. Cl.
   *G06F 12/00*   (2006.01)
(52) U.S. Cl.
   USPC .................. 711/154; 711/103; 711/E12.001; 710/52; 365/189.05
(58) Field of Classification Search
   None
   See application file for complete search history.

(56) References Cited

U.S. PATENT DOCUMENTS

| 5,956,743 | A  | * | 9/1999 | Bruce et al. | 711/103 |
| 6,285,825 | B1 | * | 9/2001 | Miwa et al.  | 386/248 |
| 6,408,040 | B2 | * | 6/2002 | Cho          | 375/377 |
| 7,050,705 | B1 | * | 5/2006 | Mori         | 386/125 |
| 2001/0026679 | A1 | * | 10/2001 | Koshino et al. | 386/97 |
| 2005/0034047 | A1 | * | 2/2005 | Stek et al. | 714/758 |
| 2008/0147963 | A1 | * | 6/2008 | Tsai et al. | 711/103 |

FOREIGN PATENT DOCUMENTS

| JP | 2002-94938   | 3/2002  |
| JP | 2003-178591  | 6/2003  |
| JP | 2004-350091  | 12/2004 |

OTHER PUBLICATIONS

Communication from Japanese Patent Office, Notice of Reasons for Rejections, mailed Jan. 15, 2009 in co-pending Japanese Application No. 2007-070925, including English language translation document (4 pages).

\* cited by examiner

*Primary Examiner* — Michael Krofcheck

(74) *Attorney, Agent, or Firm* — Finnegan, Henderson, Farabow, Garrett & Dunner, LLP

(57) ABSTRACT

A content data storage device which stores content data which includes a wide-band content and a narrow-band content includes a buffer memory temporarily storing the content data to be externally input, a storage unit including a plurality of nonvolatile memories configured to be written for each page and storing in turn the content data to be output from the buffer memory, and a controller controlling an output from the buffer memory so as to output content data of one page to the storage unit when the content data of not less than one page is stored in the buffer memory, wherein the controller adds dummy data to the narrow-band content as the content data of one page, if the narrow-band content stored in the buffer memory reaches the prescribed capacity.

4 Claims, 2 Drawing Sheets

CONTENT DATA STORAGE DEVICE AND ITS CONTROL METHOD

CROSS-REFERENCE TO RELATED APPLICATIONS

This application is based upon and claims the benefit of priority from prior Japanese Patent Application No. 2007-070925, filed Mar. 19, 2007, the entire contents of which are incorporated herein by reference.

BACKGROUND OF THE INVENTION

1. Field of the Invention

The present invention relates to a content data storage device which uses a nonvolatile memory, like a NAND flash memory in which data is written for each page, and stores content data such as audio, and relates to a control method of the storage device.

2. Description of the Related Art

A NAND flash memory that is a nonvolatile memory is characterized by its large capacity and cheap price, then, it is widely used for a digital camera, a digital audio player, etc. NAND flash memory has a problem such as its writing rate is slow. For using the NAND flash memory in a household electronic device, this problem is not marked. However, for using the NAND flash memory to a content data storage device for broadcasting, this problem becomes marked.

As regards a conventional content data storage device, connecting a plurality of NAND flash memories in parallel has been proposed as a method of compensating for the slow rate of the writing of the NAND flash memory. However, connecting the plurality of NAND flash memories in parallel increases a page size that is a unit of writing into the NAND flash memory by the parallel number of the flash memories in comparison with the single unit of a memory IC. For instance, connecting 64 NAND flash memories of which the capacity of one page is 2,048 B (byte) in parallel increases the page size up to 131,072 B. Since audio to be used in ordinal broadcasting is 48-kHz, 16-bit stereo, a data capacity for each one second is equivalent to 192 kB/s. Since the audio data may be written in the NAND flash memory only for each page, it is needed for writing the audio data into the content data storage device in which 64 NAND flash memories are connected in parallel to accumulate the audio data of 0.638 seconds in a buffer in advance.

In recording content data by a content data storage device, it is common practice to immediately perform follow-up playback after recording and confirm whether or not the content data has been correctly recorded. However, in the aforementioned case, since the audio data may not be written in the NAND flash memory of the content data storage device after accumulating the audio data of 0.638 seconds, the follow-up playback may be performed after a lapse of 0.683 seconds. While only the case in which the delay is caused by the writing time into the NAND flash memory has described, in an actual content data storage device, since the delay is caused by other factors sometimes, the follow-up playback may not be performed after a lapse of time longer than 0.683 seconds.

In the foregoing case, while 64 NAND flash memories have been connected in parallel, for storing content data of a high-speed rate, it is needed to connect in parallel the NAND flash memories of the number higher than 64. Thereby, since the page size becomes further large, to start the follow-up playback, it must wait for a time longer than the foregoing 0.683 seconds. Increasing in length of the time until the follow-up playback starts deteriorates the operability of a series of 'recording' from the start of the recording up to the follow-up playback by a user.

A semiconductor memory, which automatically certify content in data register at an address within one page as a prescribed value, and can perform writing without inputting data of one page in performing writing data of a size smaller than one page when data from the prescribed address specified by an input address up to an arbitrary address is input, is proposed (for instance, refer to Jpn. Pat. Appln. KOKAI Publication 2003-178591).

BRIEF SUMMARY OF THE INVENTION

This invention is made under the foregoing circumstances, and an object of the invention is to provide a content data storage device configured to immediately start follow-up playback and improve the operability of recording for recording content data which includes video for wide-band content items and audio for narrow-band content items, and a control method of the storage device.

According to a content data storage device regarding the invention, there is provided a content data storage device which stores content data which includes a wide-band content and a narrow-band content, comprising: a buffer memory with a capacity of a plurality of pages which temporarily stores the content data to be externally input; a storage unit which includes a plurality of nonvolatile memories configured to be written for each page and stores in turn the content data to be output from the buffer memory in the nonvolatile memories; and a controller which controls an output from the buffer memory so as to output content data of one page to the storage unit when the content data of not less than one page is stored in the buffer memory, wherein the controller determines whether or not the capacity of the narrow-band content stored in the buffer memory reaches a prescribed capacity of not more than one page, if the narrow-band content stored in the buffer memory reaches the prescribed capacity, adds dummy data to the narrow-band content as the content data of one page.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

The following will describe embodiments of the present invention in detail with reference to the drawings. An actual content data storage device stores both video data for wideband content items and audio data for narrow-band content items. Since the timing to start follow-up playback is decided in accordance with the transmission speed of the audio data, the following will describe only the writing and reading of the audio data in and from the content data storage device. The audio to be used in the embodiment is 48-kHz, 16-bit stereo, and the transmission speed of the audio data is 192 kB/s.

Figure 1:
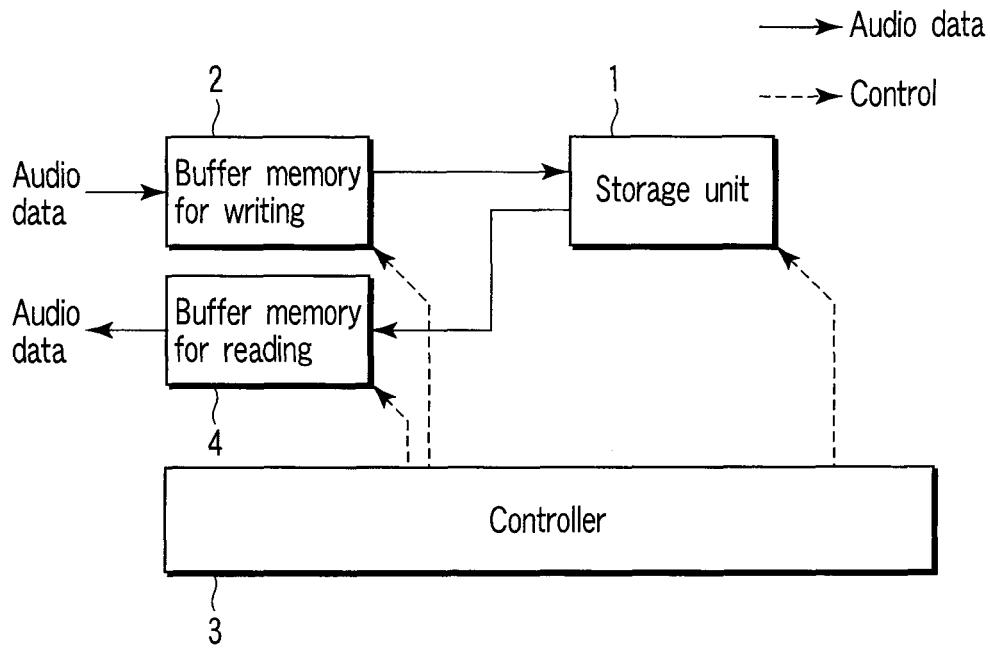
FIG. 1 is a block diagram illustrating a configuration of one exemplary embodiment of a content data storage device regarding the invention.

FIG. 1 shows a block diagram depicting a functional configuration of a content data storage device regarding the embodiment of the invention. In FIG. 1, the symbol 1 denotes a storage unit. The storage unit 1 includes 64 NAND flash memories connected in parallel. Writing content data in the respective NAND flash memories to be used in the embodiment is performed for each page (2,048 B). That is, by connecting 64 NAND flash memories in parallel, a page size of the storage unit 1 is equal to 131,072 B.

After starting the recording, the audio data is input to a buffer memory 2 for writing, and temporarily stored so that the buffer memory 2 maintains temporal matching with the writing operation of the storage unit 1 in terms of time. The temporarily stored audio data is written into the storage unit 1 in accordance with an instruction from a controller 3.

The audio data written in the NAND flash memories of the storage unit 1 is read in accordance with an instruction from the controller 3, temporarily stored in a buffer memory 4 for reading, and then, output outside.

Figure 2:
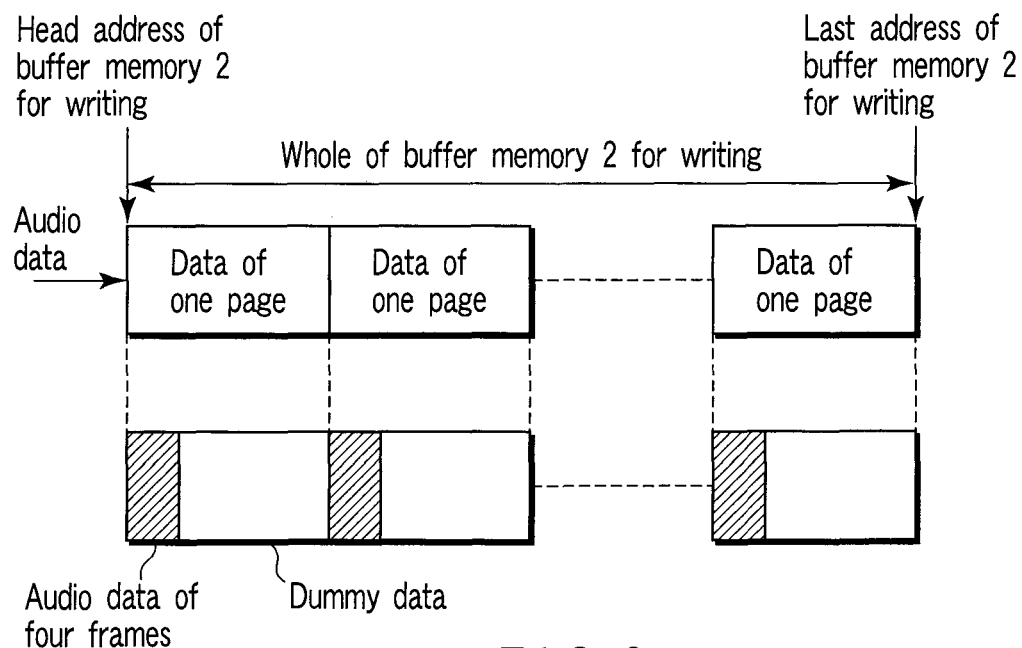
FIG. 2 is a schematic view illustrating an exemplary storage example of audio data in a buffer memory for writing of the foregoing embodiment.

FIG. 2 shows a schematic view depicting a storage example of the audio data in the buffer memory 2 for writing of the embodiment of the invention.

The buffer memory 2 has a capacity of a plurality of pages. The buffer memory 2 is configured as a ring buffer so as to write the audio data in turn from the head address, and when the writing advances to the last address, the writing returns to the head address. Since the transmission speed of the audio data is equal to 192 kB/s, it takes 0.683 seconds (about 20.7 frames) for the buffer memory 2 to store the audio data of one page.

In the embodiment, when the audio data of four frames is written into the buffer memory 2, dummy data of 16.7 frames is added by an instruction from the controller 3 and output to the NAND flash memories of the storage unit 1 as the content data of one page. Thereby, the content data storage device of the embodiment can write the audio data in the NAND flash memories at four-frame intervals. In this case, since the writing into the first NAND flash memory is completed after the lapse of four frames from the start of recording, if there is no other factor in the content data storage device, the device can perform follow-up playback from the lapse of five frames.

Adding dummy data of 16.7 frames to the audio data of four frames lowers the use efficiency of the memory for the audio data to 4/20.7 (about 19%). However, since the capacity of the content data storage device is mainly used to record the video data, the use efficiency of the entire memory is lowered slightly. In an example, in which each of one content item of video of 50 Mbps and audio are each recorded in the same period, the use efficiency of the memory by the video data is equal to about 97%. The content data storage device often records a set of one content item of video and four content items of audio from a practical standpoint, and in this situation, the use efficiency of the memory by the video data is equal to 83%.

Processing operations of the controller 3 of the embodiment will be set forth in the description which follows.

Figure 3:
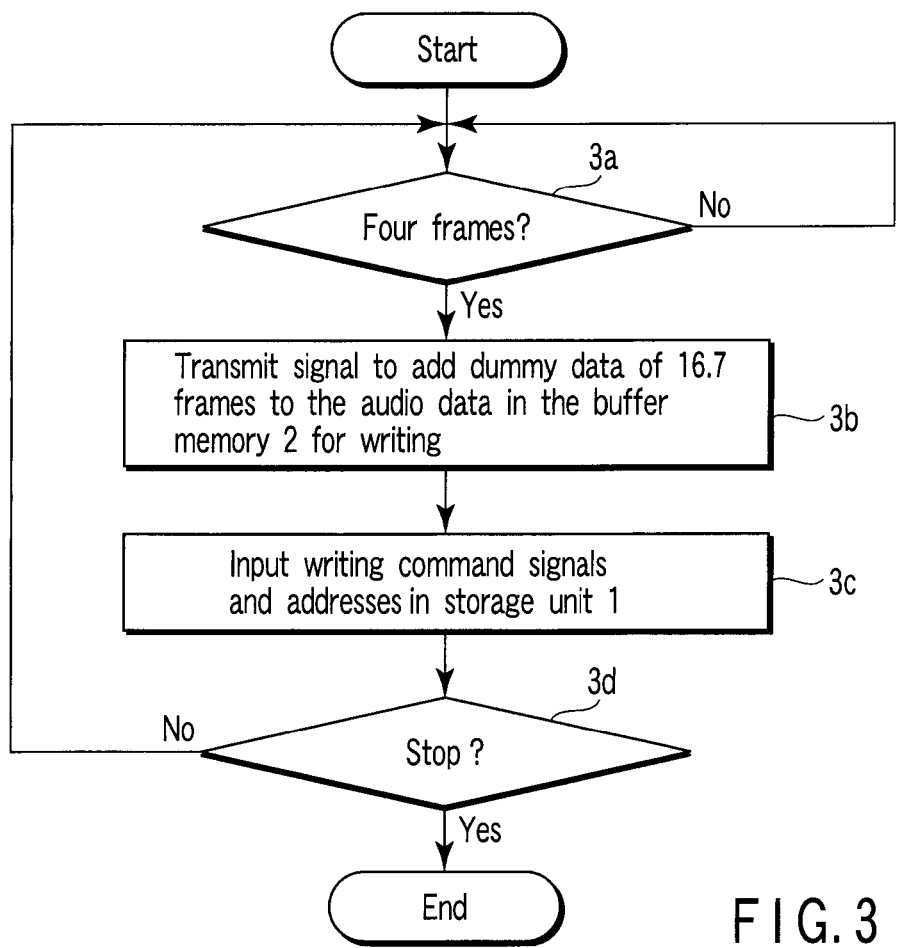
FIG. 3 is a flowchart illustrating the processing of writing the audio data into a storage unit by a controller of the embodiment.

FIG. 3 shows a flowchart depicting processing of writing of the audio data in the storage unit 1 by the controller 3 regarding the embodiment.

After starting the recording, the audio data is input to the buffer memory 2 for writing.

The controller 3 determines whether or not the audio data of four frames is stored in the buffer memory 2 through the inputting (Block 3a). When the audio data of four frames is stored (Yes, in Block 3a), the controller 3 transmits a signal showing the fact to add dummy data of 16.7-frame to the audio data of four-frame to the buffer memory 2 (Block 3b). This processing converts the audio data of four-frame stored in the buffer memory 2 into content data of one page.

In succession, the controller 3 inputs writing command signals and addresses of the writing page in the NAND flash memories in the storage unit 1 (Block 3c). When the controller 3 starts to record the content data to the storage unit 1, the controller 3 supplies the writing command signals and a start address of the writing page to the NAND flash memories in the storage unit 1. In accordance with the command signals, the NAND flash memories in the storage unit 1 are brought into active status. In accordance with the addresses, the page in which the content data is written is assigned. Then the controller 3 performs output control by which the content data of one page is output from the buffer memory 2. The storage unit 1 writes the content data of one page output from the buffer memory 2 in the page of the NAND flash memories assigned by the addresses.

The controller 3 then determines whether or not the processing of the writing should be stopped (Block 3d), if the processing should be stopped (Yes, in Block 3d), the controller 3 terminates a series of processing operations. If the processing should not be stopped (No, in Block 3d), the controller 3 shifts to Block 3a to continue the processing of the writing.

Figure 4:
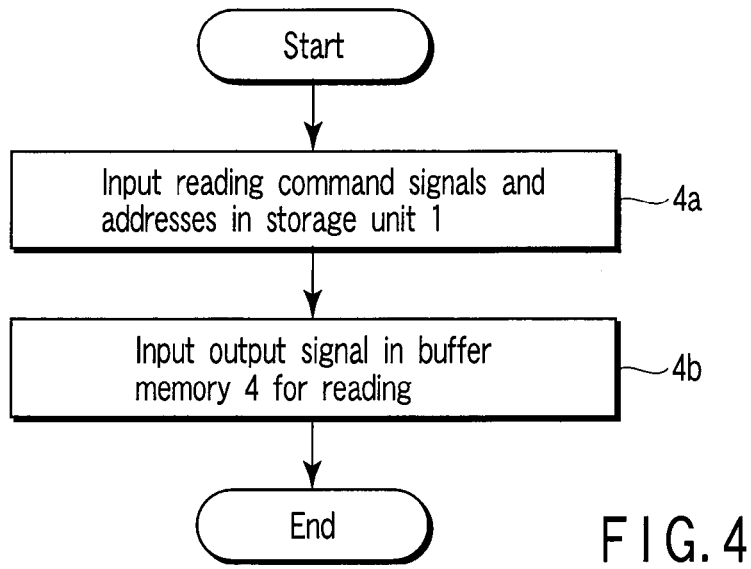
FIG. 4 is a flowchart illustrating the processing of reading the audio data from the storage unit by the controller of the embodiment.

FIG. 4 shows a flowchart depicting processing of reading of the audio data from the storage unit 1 by the controller 3 regarding the embodiment.

The controller 3 inputs reading command signals and addresses in the storage unit 1 (Block 4a). When the controller 3 starts to read the content data recorded in the storage unit 1, the controller 3 supplies the reading command signals and a start address to the NAND flash memories in the storage unit 1. Then, the controller 3 inputs an output signal to the buffer memory 4 for reading (Block 4b). Thereby, the buffer memory 4 outputs the audio data outside. The controller 3 may read only necessary data not for each page. Accordingly, there is no need to read the added dummy data and may avoid useless reading time.

As given above, in the embodiment, although the configuration of the buffer memory 2 is similar to the conventional one, the buffer memory 2 employs different system in data writing to the storage unit 1. In other words, the conventional writing system simply writes the input audio data in the buffer memory 2, and determines that the data capacity is equal to and larger than one page to write the audio data in the storage unit 1. In contrast, the present invention employs a system of adding dummy data to the audio data for every four frame and forcibly writing the audio data in the storage unit 1. Thereby, the content data storage device can write the audio data of one page in the storage unit 1 at short time intervals.

Therefore, since the content data storage device regarding the embodiment can immediately start the follow-up playback of the content data, the storage device can improve the operability in a series of 'recording' from the start of recording up to termination of the follow-up playback.

The present invention is not limited to the foregoing embodiment. For instance, while the embodiment has described the example of the storage unit in which 64 NAND flash memories are connected in parallel, the case of use of a storage unit in which NAND flash memories of more than 64 or less than 64 are connected in parallel may be embodied in the same manner. At using more than 64 flash memories, the content data storage device further increases its page size, and the invention enlarges its effect.

While the embodiment has described the example of the transmission speed of the audio data of 192 kB/s, a content data storage device having any speed other than the given speed can be embodied.

While the example in which the dummy data of 16.7 frames is added when the audio data of four frames is stored in the buffer memory 2 has described, the data capacity to be stored in the buffer memory 2 in advance is not limited to four frames, and this invention can be changed in other forms without departing from the spirit or scope of the general inventive concept thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A content data storage device which includes a plurality of nonvolatile memories to which content data is written per page, and stores content data including at least video data and audio data in the nonvolatile memories, comprising:
   a write buffer memory which receives and stores the video data and the audio data, wherein the write buffer memory includes contiguous pages, each page with a predetermined data size for storing the audio data;
   a storage unit which includes a plurality of nonvolatile memories, the storage unit storing the video data and the audio data outputted from the write buffer memory in the plurality of nonvolatile memories; and
   a write controller which determines when the audio data stored in one page of the continuous pages reaches a preset amount, where the preset amount is less than the predetermined data size, and supplies the write buffer memory with a command to add dummy data to the audio data stored in the one page from the preset amount until a combined size of the dummy data and the audio data reaches the predetermined data size;
   wherein the write controller further commands the write buffer to output the one page as resultant data; and
   wherein the write controller signals the storage unit to store the resultant data including both the dummy data and the stored audio data.

2. The content data storage device according to claim 1, further comprising a read controller which reads the audio data from the storage unit and a read buffer memory which temporarily buffers and outputs the read audio data.

3. A control method for use in a content data storage device which stores content data including at least video data and audio data in a plurality of nonvolatile memories to which the content data is written per page, comprising:
   receiving and storing, by a write buffer memory, the video data and the audio data, wherein the write buffer memory includes contiguous pages, each page with a predetermined data size for storing the audio data;
   determining when the audio data stored in one page of the contiguous pages reaches a preset amount, where the preset amount is less than the predetermined data size, and adding dummy data to the audio data stored in the one page from the preset amount until a combined size of the dummy data and the audio data reaches the predetermined data size;
   outputting the one page as resultant data after completion of the adding of the dummy data; and
   storing the resultant data outputted from the write buffer memory in the plurality of nonvolatile memories of the storage unit, wherein the resultant data includes both the dummy data and the stored audio data.

4. The control method according to claim 3, further comprising:
   reading the audio data from the storage unit; and
   temporarily buffering the read audio data in a read buffer memory.

* * * * *